(12) United States Patent
Xiao et al.

(10) Patent No.: US 11,355,697 B2
(45) Date of Patent: Jun. 7, 2022

(54) NANOMETER SCALE NONVOLATILE MEMORY DEVICE AND METHOD FOR STORING BINARY AND QUANTUM MEMORY STATES

(71) Applicant: The Board of Trustees of the Leland Stanford Junior University, Stanford, CA (US)

(72) Inventors: Jun Xiao, Stanford, CA (US); Aaron Lindenberg, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 17/103,710

(22) Filed: Nov. 24, 2020

(65) Prior Publication Data

US 2021/0159398 A1 May 27, 2021

Related U.S. Application Data

(60) Provisional application No. 62/940,181, filed on Nov. 25, 2019.

(51) Int. Cl.
*G11C 11/18* (2006.01)
*H01L 43/06* (2006.01)
(Continued)

(52) U.S. Cl.
CPC .............. *H01L 43/06* (2013.01); *G06N 10/00* (2019.01); *G11C 11/18* (2013.01); *H01L 27/228* (2013.01);
(Continued)

(58) Field of Classification Search
CPC ....... H01L 43/06; H01L 27/228; H01L 43/04; H01L 43/10; H01L 43/14; G06N 10/00;
(Continued)

(56) References Cited

U.S. PATENT DOCUMENTS

| 6,184,081 B1 * | 2/2001 | Jeng | H01L 27/10894 257/E21.011 |
| 6,395,388 B1 * | 5/2002 | Iwasaki | B82Y 25/00 324/252 |

(Continued)

*Primary Examiner* — Michael T Tran
(74) *Attorney, Agent, or Firm* — Foley & Lardner LLP

(57) ABSTRACT

Example implementations include an electronic memory device with a metallic layer having a first planar crystalline structure, a first encapsulating layer including an encapsulating material having a second planar crystalline structure, and disposed adjacent to a first planar surface of the metallic layer, and a second encapsulating layer including the encapsulating material, and disposed adjacent to a second planar surface of the metallic layer. Example implementations also include a method of depositing graphite crystals onto a substrate to form a gate bottom layer, depositing BN crystals onto the graphite bottom layer to form a BN bottom layer, depositing tungsten ditelluride (WTe$_2$) crystals onto the BN bottom layer to form a metallic layer, depositing the BN crystals onto the BN bottom layer and the metallic layer to form a BN top layer, and depositing the graphite crystals onto the BN top layer to form a gate top layer.

20 Claims, 12 Drawing Sheets

(51) Int. Cl.
  *H01L 27/22* (2006.01)
  *H01L 43/04* (2006.01)
  *G06N 10/00* (2022.01)
  *H01L 43/14* (2006.01)
  *H01L 43/10* (2006.01)
(52) U.S. Cl.
  CPC .............. *H01L 43/04* (2013.01); *H01L 43/10* (2013.01); *H01L 43/14* (2013.01)
(58) Field of Classification Search
  CPC ......... G11C 11/18; G11C 13/00; G11C 11/56; B82Y 10/00
  USPC .................................................. 365/170, 173
  See application file for complete search history.

(56) References Cited

U.S. PATENT DOCUMENTS

| | | | | |
|---|---|---|---|---|
| 8,163,581 B1* | 4/2012 | Or-Bach | ............. | H01L 31/0725 438/39 |
| 9,941,293 B1* | 4/2018 | Pang | ................ | H01L 27/11519 |
| 10,319,907 B1* | 6/2019 | Desu | ................... | H01L 45/1246 |
| 10,600,781 B1* | 3/2020 | Xiao | ................ | H01L 27/11551 |
| 2006/0113005 A1* | 6/2006 | Ando | ....................... | C23C 22/78 148/254 |
| 2007/0077454 A1* | 4/2007 | Sakamoto | ............ | H01F 41/026 428/693.1 |
| 2007/0123054 A1* | 5/2007 | Storaska | ................. | H01L 27/10 438/745 |
| 2009/0129174 A1* | 5/2009 | Madurawe | ............... | G11C 8/16 365/189.08 |
| 2009/0242880 A1* | 10/2009 | Chen | ................... | H01L 45/1233 257/42 |
| 2013/0051150 A1* | 2/2013 | Roizin | ............. | H01L 27/11582 365/185.18 |
| 2013/0052803 A1* | 2/2013 | Roizin | ............... | H01L 29/7881 438/478 |
| 2014/0027875 A1* | 1/2014 | Hasegawa | ........... | H01L 31/1868 257/432 |
| 2014/0119167 A1* | 5/2014 | Mihara | ............. | G11B 7/24065 369/59.1 |
| 2015/0179705 A1* | 6/2015 | Wouters | ................ | H01L 27/249 257/5 |
| 2015/0243674 A1* | 8/2015 | Shih | .................. | H01L 21/31111 438/268 |
| 2016/0072045 A1* | 3/2016 | Kanaya | .................... | H01L 43/08 257/427 |
| 2016/0148788 A1* | 5/2016 | Tsai | ................... | H01J 37/32477 277/652 |
| 2016/0358927 A1* | 12/2016 | Nam | ................ | H01L 27/11582 |
| 2018/0005974 A1* | 1/2018 | Chiu | ..................... | H01L 25/105 |
| 2019/0237470 A1* | 8/2019 | Mine | ..................... | H01L 27/11597 |
| 2019/0252605 A1* | 8/2019 | Redaelli | ................ | H01L 45/122 |
| 2020/0006364 A1* | 1/2020 | Rabkin | ................ | H01L 27/11519 |
| 2020/0035296 A1* | 1/2020 | Riel | .................... | G06N 3/0635 |
| 2020/0066917 A1* | 2/2020 | Kula | ................... | H01L 29/7788 |
| 2020/0181801 A1* | 6/2020 | Ryoki | ................... | C30B 15/203 |
| 2021/0104659 A1* | 4/2021 | Fukuzawa | ............ | H01F 10/131 |
| 2021/0143082 A1* | 5/2021 | Gong | ............... | H01L 23/3731 |
| 2021/0288108 A1* | 9/2021 | Sharma | ................ | H01L 27/2427 |

* cited by examiner

NANOMETER SCALE NONVOLATILE MEMORY DEVICE AND METHOD FOR STORING BINARY AND QUANTUM MEMORY STATES

CROSS-REFERENCE TO RELATED PATENT APPLICATIONS

This application claims priority to U.S. Provisional Patent Application Ser. No. 62/940,181, entitled "LOW-ENERGY COST BERRY CURVATURE MEMORY BASED ON NANOMETER-THICK LAYERED MATERIALS," filed Nov. 25, 2019, the contents of such application being hereby incorporated by reference in its entirety and for all purposes as if completely and fully set forth herein.

STATEMENT REGARDING FEDERALLY SPONSORED RESEARCH OR DEVELOPMENT

This invention was made with Government support under contract DE-AC02-76SF00515 awarded by the Department of Energy. The Government has certain rights in the invention.

TECHNICAL FIELD

The present implementations relate generally to electronic memory devices, and more particularly to a nanometer scale nonvolatile memory device for storing binary and quantum memory states.

BACKGROUND

Applications in computation with complex and significant memory storage requirements are increasingly common. Applications including but not limited to distributed computing, Internet of Things, artificial intelligence, distributed computing, graphical processing, and the like all require increasing memory to perform complex computations. However, conventional systems may not effectively support appropriately physically dense, energy efficient, and materially stable memory devices. Moore's Law, memory walls, and heat walls at nanometer scale all limit conventional memory devices. Further, logical memory density can be limited by memory devices unable to store quantum and binary memory states. Thus, a technological solution for a nanometer scale nonvolatile memory device for storing binary and quantum memory states is desired.

SUMMARY

Example implementations include an electronic memory device with a metallic layer having a first planar crystalline structure, a first encapsulating layer including an encapsulating material having a second planar crystalline structure, and disposed adjacent to a first planar surface of the metallic layer, and a second encapsulating layer including the encapsulating material, and disposed adjacent to a second planar surface of the metallic layer.

Example implementations also include a method of depositing graphite crystals onto a substrate to form a gate bottom layer, depositing BN crystals onto the graphite bottom layer to form a BN bottom layer, depositing tungsten ditelluride ($WTe_2$) crystals onto the BN bottom layer to form a metallic layer, depositing the BN crystals onto the BN bottom layer and the metallic layer to form a BN top layer, and depositing the graphite crystals onto the BN top layer to form a gate top layer.

Example implementations also include a method of applying an alternating current to a first terminal and a second terminal of an electronic memory device, the electronic memory device including a metallic layer having a first planar crystalline structure, a first encapsulating layer including an encapsulating material having a second planar crystalline structure, and a second encapsulating layer including the encapsulating material, inducing a Berry dipole at the metallic layer in response to the alternating current, and detecting the Berry dipole by a voltage detector operatively coupled to a third terminal and a fourth terminal of the electronic device.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

An example electronic memory device in accordance with present implementations is capable of storing memory bits non-destructively at nanometer scale exceeding conventional memory devices. Further, some implementations in accordance with present implementations, are capable of storing a quantum logical, bit, or like state alongside binary ON and OFF states. In some implementations, the example electronic memory device is capable of nanometer scale size and packaging smaller than conventional systems, and quantum state storage driven by crystalline plane movement in the storage layer at atomically thin scales. In some implementations, the example electronic memory device is capable of achieving and storing binary and quantum state storage by effecting at least three electrically and physically distinct states as a result of movement of crystalline planes of the storage layer. Thus, the storage layer is able to achieve both atomic thinness and quantum storage by its physical and electrical properties.

Figure 1A:
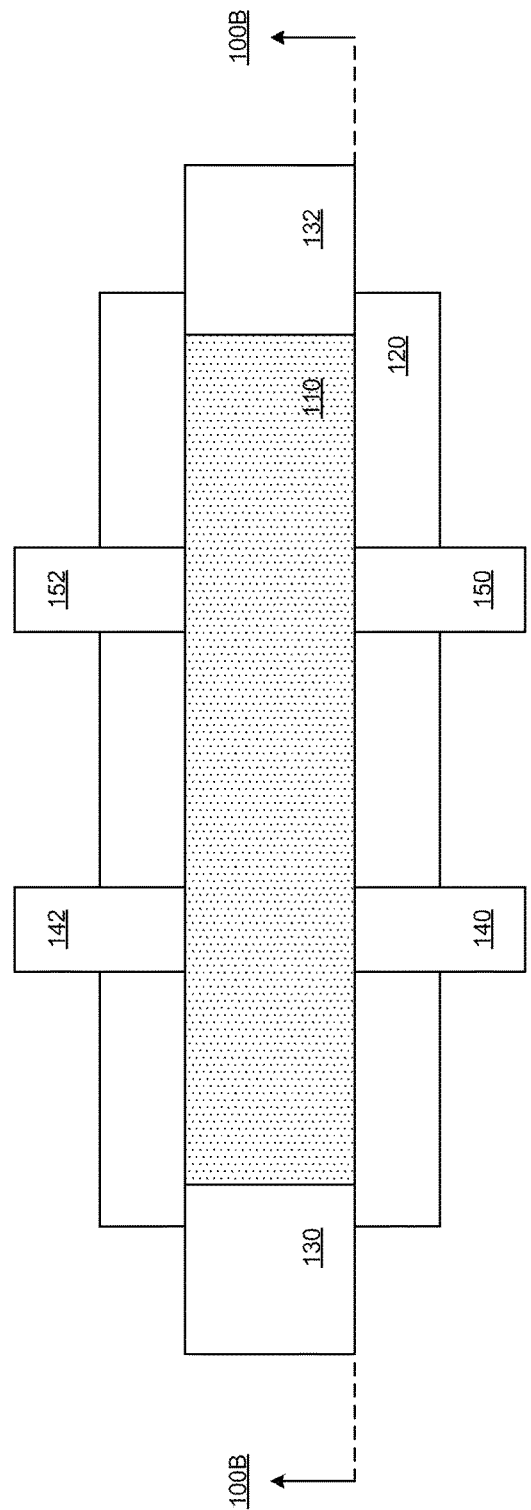
FIG. 1A illustrates a plan view of an example electronic memory device, in accordance with present implementations.

FIG. 1A illustrates a plan view of an example electronic memory device, in accordance with present implementations. As illustrated by way of example in FIG. 1A, an example memory device in plan view 100A includes at least a metallic layer 110, a first encapsulating layer 120, a first device terminal 130, a second device terminal 132, a first cell terminal 140, a second cell terminal 142, a third cell terminal 150, and a fourth cell terminal 152. In some implementations, the example memory device is operable to maintain one or more electrical or like states corresponding to one or more distinct electrical charge states. In some implementations, the example electronic memory device a solid-state device having a nanometer-scale memory cell. In some implementations, the example memory device has a rectangular shape in a plan view, and has a rectangular prism shape.

The metallic layer 110 includes a semimetallic, metallic, or like material responsive to electrical stimulation. In some implementations, the metallic layer 110 is an tungsten ditelluride (WTe$_2$) compound arranged in a plurality of planar crystal lattice structures. In some implementations, the metallic layer 110 contains a small number of stacked planar crystal lattice structures. In some implementations, the metallic layer includes between three and five stacked planar crystal lattice structures. In some implementations, the metallic layer 110 has a total thickness in a direction perpendicular to the plane of the metallic structure of under 5 nanometers (nm). In some implementations, the thickness of the metallic layer 310 is dependent on the number of crystalline planes stacked to form the metallic layer 110. As one example, a metallic layer having three stacked crystalline planes can have a lesser thickness than a metallic layer having five stacked crystalline planes. In some implementations, the metallic layer 110 includes an odd number of stacked crystalline planes. As one example, the metallic layer can include three crystalline plane, in which a middle crystalline plane is disposed between two outer crystalline planes forming upper and lower planar surfaces of the metallic layer 110. In some implementations, the metallic layer 110 has a rectangular shape in a plan view, and has a rectangular prism shape.

In some implementations, the metallic layer 110 is doped according to one or more doping processes. In some implementations, doping of the metallic layer 110 results in modification of transition energy cost. In some implementations, doping of the metallic layer 110 results in affinity of the planar crystal lattice structure of the metallic layer 110 to return to a steady, default, or like state. In some implementations, the default state can be considered as, assigned to, associated with, or the like, one of a logical ON state, OFF state, and quantum state. Thus, in some implementations, the metallic layer 110 has an electrically tunable transition barrier, allowing for a memory storage application requiring low coercive fields for easy "writing" and high coercive fields for storage resistant to outside electromagnetic interference. In some implementations, an electrical field applicable to the metallic layers can be described by Equation 1, under an external doping state described by Equation 2, where $V_t$ is a bias voltage applied to the gate top layer 162, $V_b$ is a bias voltage applied to the gate bottom layer 160, $d_t$ is a thickness of the boron nitride top layer, and $d_b$ is a thickness of the boron nitride bottom layer:

$$E_\perp = \frac{\frac{V_b}{d_b} - \frac{V_t}{d_t}}{2} \qquad \text{Eq. (1)}$$

$$n_h = -\frac{\varepsilon_{h-BN}\varepsilon_0\left(\frac{V_t}{d_t} + \frac{V_b}{d_b}\right)}{e} \qquad \text{Eq. (2)}$$

The first encapsulating layer 120 includes a dielectric or like material in contact with the metallic layer 110. In some implementations, the first encapsulating layer is or includes boron nitride (BN) or hexagonal boron nitride (h-BN). In some implementations, the encapsulating layer is arranged in a plurality of stacked crystalline planes similar in arrangement to the stacked crystalline planes of the metallic layer. In some implementations, that first encapsulating layer 120 is formed with a planar surface both wider and longer than the planar surface of the metallic layer 110. Thus, in some implementations, the first encapsulating layer 120 completely surrounds, encloses, or the like, a lower portion of the metallic layer. Thus, the first encapsulating layer achieves the technological solution of minimal package size at the nanometer level by its BN or h-BN structure. In some implementations, the first encapsulating layer 120 has a rectangular shape in a plan view, and has a rectangular prism shape.

The first device terminal 130 includes a conductive or like material in contact with the metallic layer 110 at a first end thereof. In some implementations, the first device terminal 130 is located at a first end of the metallic layer 110 and in substantial planar alignment with the metallic layer 110. In some implementations, the first device terminal is disposed in contact with at least a portion of a first end of the metallic layer along a longest direction of the metallic layer 110. In some implementations, the conductive material is or includes platinum. In some implementations, the conductive material is or includes a coating of at least one of chromium and gold disposed as separate layers, regions, or the like. Alternatively, in some implementations, the conductive material is or includes a coating of at least one of chromium and gold disposed as a combined mixture, alloy, or the like. The second device terminal 132 includes the conductive or like material in contact with the metallic layer 110 at a second end thereof. In some implementations, the second end of the metallic layer 110 is located at a face opposite to a face of the first end of the metallic layer 110, along a longest length direction of the metallic layer 110. Thus, in some implementations, the second device terminal 132 is located at an opposite end of the metallic layer 110 and, together with the first device terminal 130, extends the metallic layer 110 along its length. In some implementations, the second device terminal 132 corresponds to the first device terminal 130 in at least one of orientation, shape, composition, and the like. In some implementations, the configuration of the device terminals 130 and 132 allows current flow along a crystalline a-axis.

The first cell terminal 140 includes a conductive or like material in contact with the metallic layer 110 at a first portion of a first side thereof. In some implementations, the first cell terminal 140 is located at a first side of the metallic layer 110 perpendicular to the first end and the second end of the metallic layer 110. In some implementations, the first cell terminal 140 is in substantial planar alignment with the metallic layer 110. Thus, in some implementations, the first cell terminal 140 extends perpendicularly from the metallic layer 110 with respect to the length of the metallic layer 110. In some implementations, the conductive material is or includes platinum. In some implementations, the conductive material is or includes a coating of at least one of chromium and gold disposed as separate layers, regions, or the like. Alternatively, in some implementations, the conductive material is or includes a coating of at least one of chromium and gold disposed as a combined mixture, alloy, or the like. The second cell terminal 142 includes a conductive or like material in contact with the metallic layer 110 at a first portion of a second side thereof. In some implementations, the second cell terminal 142 is located at a second side of the metallic layer 110 opposite to the first side of the metallic layer 110. Thus, in some implementations, the second cell terminal 142 is located across the first cell terminal 140 with respect to the metallic layer 110, and extends perpendicularly from the metallic layer 110 with respect to the length of the metallic layer 110. In some implementations, the configuration of the cell terminals allows alignment with a nonlinear Hall effect along a crystalline b-axis.

The third cell terminal 150 includes a conductive or like material in contact with the metallic layer 110 at a second portion of the first side thereof. In some implementations, the third cell terminal 150 is located at the first side of the metallic layer 110 and adjacent to the first cell terminal 140. The fourth cell terminal 152 includes a conductive or like material in contact with the metallic layer 110 at a second portion of the second side thereof. In some implementations, the fourth cell terminal 140 is located at the second side of the metallic layer 110 and adjacent to the second cell terminal 142. In some implementations, the second, third, and fourth cell terminals 142, 150 and 152 correspond to the first cell terminal 140 in at least one of orientation, shape, composition, and the like.

Figure 1B:
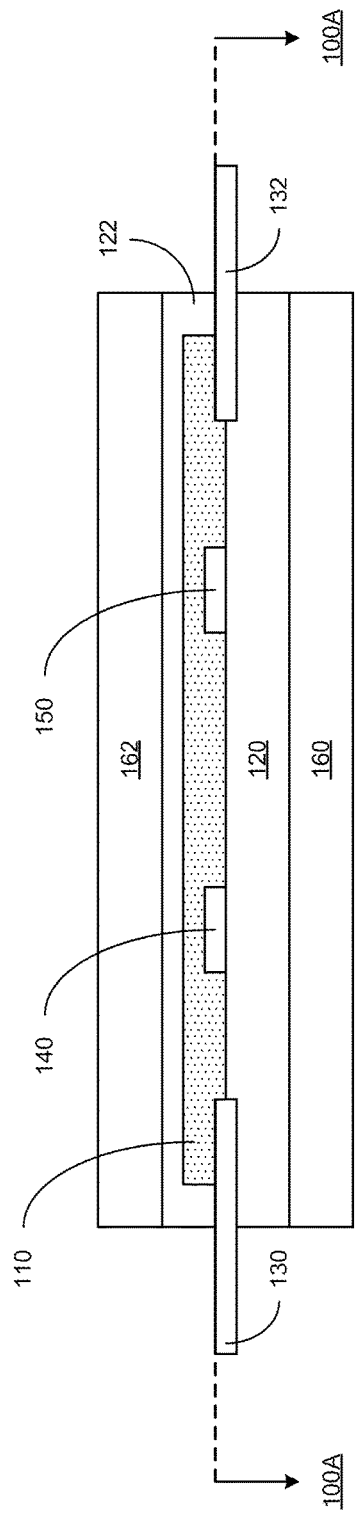
FIG. 1B illustrates a cross-sectional view of the example electronic memory device of FIG. 1.

FIG. 1B illustrates a cross-sectional view of the example electronic memory device of FIG. 1. As illustrated by way of example in FIG. 1B, the example memory device in cross-sectional view 100B includes at least the metallic layer 110, the first encapsulating layer 120, a second encapsulating layer 122, the first device terminal 130, the second device terminal 132, the first cell terminal 140, the second cell terminal 142, a first gate layer 160, and a second gate layer 162. In some implementations, the example electronic memory device in view 100B includes a multiplayer stack of a plurality of layers encapsulating and packaging the metallic layer 110. The second cell terminal 142 and the third cell terminal 152 are present in the example electronic memory device of FIG. 1, but not visible from view 100B.

The second encapsulating layer 122 includes a dielectric or like material in contact with the metallic layer 110 and the first encapsulating layer 120. In some implementations, the metallic layer 110 is enclosed within the first encapsulating layer 120 and the second encapsulating layer 122. In some implementations, the second encapsulating layer 122 corresponds to the first encapsulating layer 120 in at least one of orientation, shape, composition, and the like.

The first gate layer 160 includes a dielectric or like material in contact with the first encapsulating layer 120. In some implementations, the first gate layer 160 is disposed in contact with the first encapsulating layer 120 on a face opposite to the metallic layer 110. Thus, in some implementations, the first gate layer 160 is a bottom surface of the example electronic memory device. In some implementations, the first gate layer 160 extends along an entire planar surface of first encapsulating layer 120. In some implementations, the first gate layer 120 is or includes graphite, exfoliated graphite, and the like. The second gate layer 162 includes a dielectric or like material in contact with the second encapsulating layer 122. In some implementations, the second gate layer 162 is disposed in contact with the second encapsulating layer 122 on a face opposite to the metallic layer 110. Thus, in some implementations, the second gate layer 162 is a top surface of the example electronic memory device. In some implementations, at least one of the first and second gate layers 160 and 162 includes at least one terminal contact pad disposed thereon. In some implementations, the terminal contact pad is or includes a conductive material deposited on at least one surface of at least one of the first and second gate layers 106 and 162. In some implementations, the conductive material is or includes at least one of chromium and gold disposed as separate layers, regions, or the like. Alternatively, in some implementations, the conductive material is or includes at least one of chromium and gold disposed as a combined mixture, alloy, or the like.

Figure 1C:
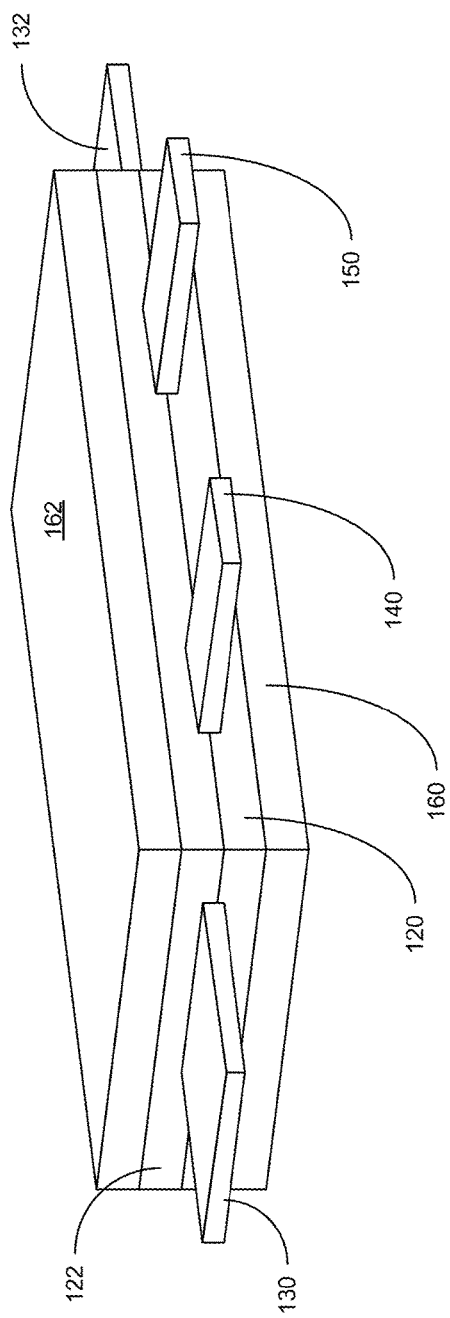
FIG. 1C illustrates an isometric view of the example electronic memory device of FIG. 1.

FIG. 1C illustrates an isometric view of the example electronic memory device of FIG. 1. As illustrated by way of example in FIG. 1C, the example memory device in cross-sectional view 100C includes at least the first encapsulating layer 120, the second encapsulating layer 122, the first device terminal 130, the second device terminal 132, the first cell terminal 140, the third cell terminal 150, the first gate layer 160, and the second gate layer 162. In some implementations, the example electronic memory device includes a nanometer-scale package enclosing the nanometer scale metallic layer 110. In some implementations, the package includes device terminals 130 and 132 and cell terminals 140, 142, 150 and 152 extending therefrom. In some implementations, the package also includes gate terminals comprising at least a portion of the first and second gate layers 160 and 162. In some implementations, the device terminals 130 and 132 extend outward from ends of the package, the cell terminals 140, 142, 150 and 152 extend outward from sides of the package, and the gate terminal are integrated with gate layers 160 and 162 on top and bottom surfaces of the package. Thus in some implementations, the metallic layer is contained entirely within a nanometer-scale device package including multiple extending and nonextending terminals and terminal contacts.

Figure 2:
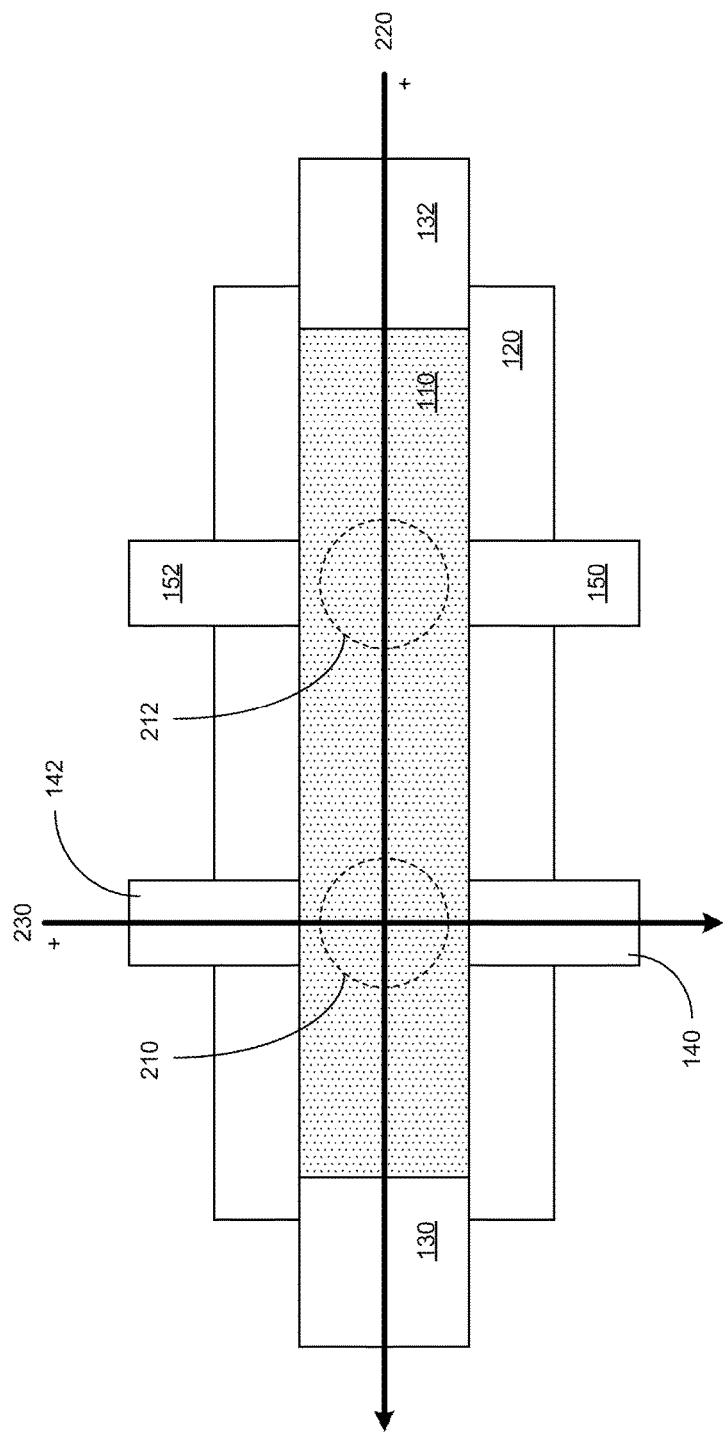
FIG. 2 illustrates an example activation state of an example electronic memory device, in accordance with present implementations.

FIG. 2 illustrates an example activation state of an example electronic memory device, in accordance with present implementations. As illustrated by way of example in FIG. 2, an example memory device in plan view 200 includes at least the metallic layer 110, the first encapsulating layer 120, the first device terminal 130, the second device terminal 132, the first cell terminal 140, the second cell terminal 142, the third cell terminal 150, and the fourth cell terminal 152. In some implementations, the example electronic memory device is operable to receive an input current 220 and detect a voltage response 230 in response to the input current 220 at least one of memory state regions 210 and 212 within the metallic layer 110.

The memory state regions 210 and 212 are disposed within the metallic layer 110 and at the intersection of axes including the device terminals 130 and 132, and various pairs of the cell terminals 140, 142, 150 and 152. The first memory state region 210 is disposed at an intersection of a device axis including the device terminal 130 and 132, and a first cell axis including the first and second cell terminals 140 and 142. Similarly, in some implementations, the second memory state region 212 is disposed at an intersection of the device axis including the device terminal 130 and 132, and a second cell axis including the third and fourth cell terminals 150 and 152. In some implementations, applied input current 220, and a second harmonic of the voltage response 230 along the b-axis $V_{\perp,2\omega}$, have a quadratic relationship. In some implementations, the second harmonic of the voltage response 230 $V_{\perp,2\omega}$ has a magnitude of 0.1% of the voltage response 230 $V_{in,\omega}$. In some implementations, the Berry curvature dipole is proportional to the voltage response 230 $V_{in,\omega}$ and the second harmonic of the voltage response 230 by Equation 3, with respect to the a-axis and the c-axis, where $\Omega_j$ is a Berry curvature along a j direction, and $f_0$ is the equilibrium electron distribution:

$$D_{ac} = -\int_k \Omega_c \partial_a f_0 \sim \frac{V_{\perp,2\omega}}{V_{in,\omega}^2} \qquad \text{Eq. (3)}$$

The input current 220 can flow across the example electronic memory device from one device terminal to the other. In some implementations, the input current 220 is an alternating current. In some implementations, the input current flows to the first device terminal 130 from the second device terminal 132. It is to be understood that the input current 220 is not limited to flowing in the example direction illustrated in FIG. 2.

The voltage response 230 is detectable across the first and second cell terminals 140 and 142, and is responsive to electrical activity at the first memory state region 210. It is to be understood that the voltage response 230 is not limited to a positive voltage response from cell terminal 142 to cell terminal 140. In some implementations, the voltage response 230 varies in response to at least one of a magnitude of the input current 220, a frequency of the input current 220, a composition of the metallic layer 110, and a doping characteristic of the metallic layer 110.

Figure 3:
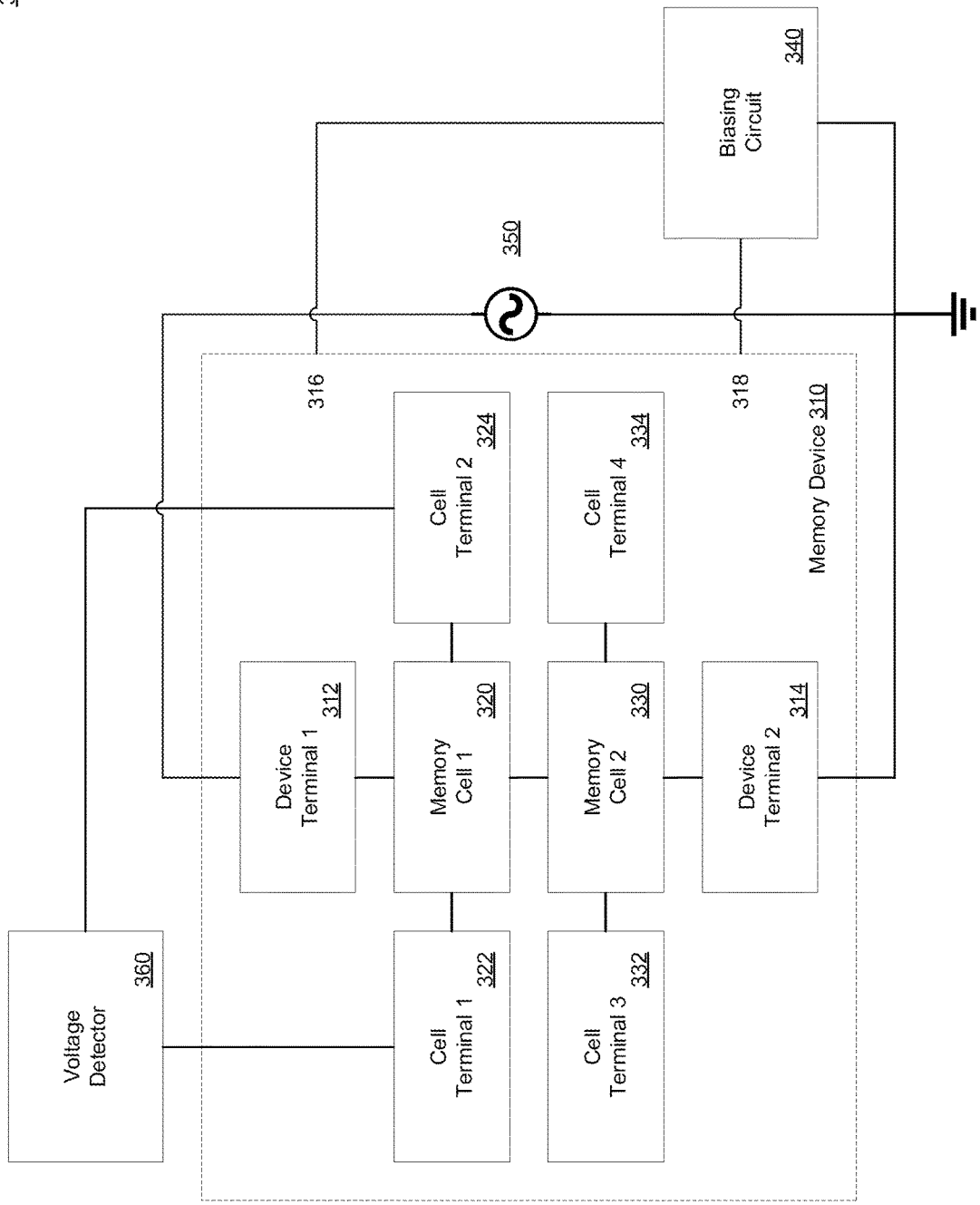
FIG. 3 illustrates an example electronic circuit system of an example electronic memory device, in accordance with present implementations.

FIG. 3 illustrates an example electronic circuit system of an example electronic memory device, in accordance with present implementations. As illustrated by way of example in FIG. 3, example electronic circuit system 300 includes a memory device 310, a biasing circuit 340, a current source 350, and voltage detector 360.

The memory device 310 is an electronic circuit system in accordance with the example electronic memory device of FIGS. 1A-1C. In some implementations, the memory device is operable in accordance with the example activation state of FIG. 2, and other activation states in accordance with present implementations. The memory device 310 includes a first device terminal 312, a second device terminal 314, a first gate terminal 316, a second gate terminal 318, a first memory cell 320, a first cell terminal 322, a second cell terminal 324, a second memory cell 330, a third cell terminal 332, and a fourth cell terminal 334.

The first and second device terminals 312 and 314 operatively couple the first and second memory cells 320 and 330 to the current source 350, and are operable to transmit the input current 220 through the first and second memory cells 320 and 330. In some implementations, the first and second device terminals 312 and 314 respectively correspond to the first and second device terminals 130 and 132. The first and second gate terminals 316 and 318 operatively coupled the memory device 310 to the biasing circuit 340, and are operable to receive a biasing voltage from the biasing circuit to bias the memory device 310. In some implementations, the first and second gate terminals 316 and 318 are operable to receive different voltages from each other from the biasing circuit 340. In some implementations, the first and second gate terminals 316 and 318 respectively correspond to the first and gate layer 160 and 162.

The first and second memory cells 320 and 330 are operable to store binary or quantum states by changes in electrical states thereof. In some implementations, the first and second memory cells 320 and 330 are operable to store and transmit distinct or independent binary or quantum states from each other. Alternatively, the first and second memory cells 320 and 330 are operable to store and transmit like, identical, dependent, or interdependent binary or quantum states with respect to each other. In some implementations, each of the first and second memory cells 320 and 330 is operable to transmit three distinct electrical states representing two binary states. In some implementations, each of the first and second memory cells 320 and 330 is operable to transmit three distinct electrical states representing two binary states and one quantum state. In some implementations, the first and second memory cells 320 and 330 respectively correspond to the first and second memory state regions 210 and 212 of the metallic layer 110.

The first and second cell terminals 322 and 324 operatively couple the first and second memory cells 320 and 330 to the voltage detector 360, and are operable to receive the response voltage 230 from the first memory cell 320. In some implementations, the first and second cell terminals 322 and 324 respectively correspond to the first and second cell terminals 140 and 142. The third and fourth cell terminals 332 and 334 are operatively coupled to the first and second memory cells 320 and 330. In some implementations, the third and fourth cell terminals 332 and 334 are operably coupleable to the voltage detector 360. In some implementations, the third and fourth cell terminals 332 and 334 are operable to receive a response voltage from the second memory cell 330. In some implementations, the first and second cell terminals 322 and 324 respectively correspond to the first and second cell terminals 140 and 142.

The biasing circuit 340 is operable to apply at least one bias voltage to the first and second gate terminals 316 and 318. In some implementations, the biasing circuit 340 applied a first bias voltage to the first gate terminal 316 and a second, different, bias voltage to the second gate terminal 318. In some implementations, first bias voltage is a positive voltage from ground, and the second bias voltage is a negative voltage from ground. It is to be understood that the ground voltage can be a true ground, relative ground, reference voltage, or the like. The current source 350 is operable to apply the input current 220 to the memory device. In some implementations, the current source 350 is operable to apply an alternating current to the memory device 110. In some implementations, the current source 350 is commonly grounded with the biasing circuit 340.

The voltage detector 360 is operable to detect one or more response voltages from one or more of the first and second memory cells 320 and 330. In some implementations, the voltage detector 360 is operable to detect the response voltage 220. It is to be understood that the voltage detector 360 can detect response voltages from one or more of the first and second memory cells 320 and 330 simultaneously or concurrently. It is to be further understood that the memory device can comprise an arbitrary number of memory blocks including one memory cell and two memory terminals, and that the voltage detector 360 can detect voltage response from an arbitrary number of corresponding memory cells.

Figure 4:
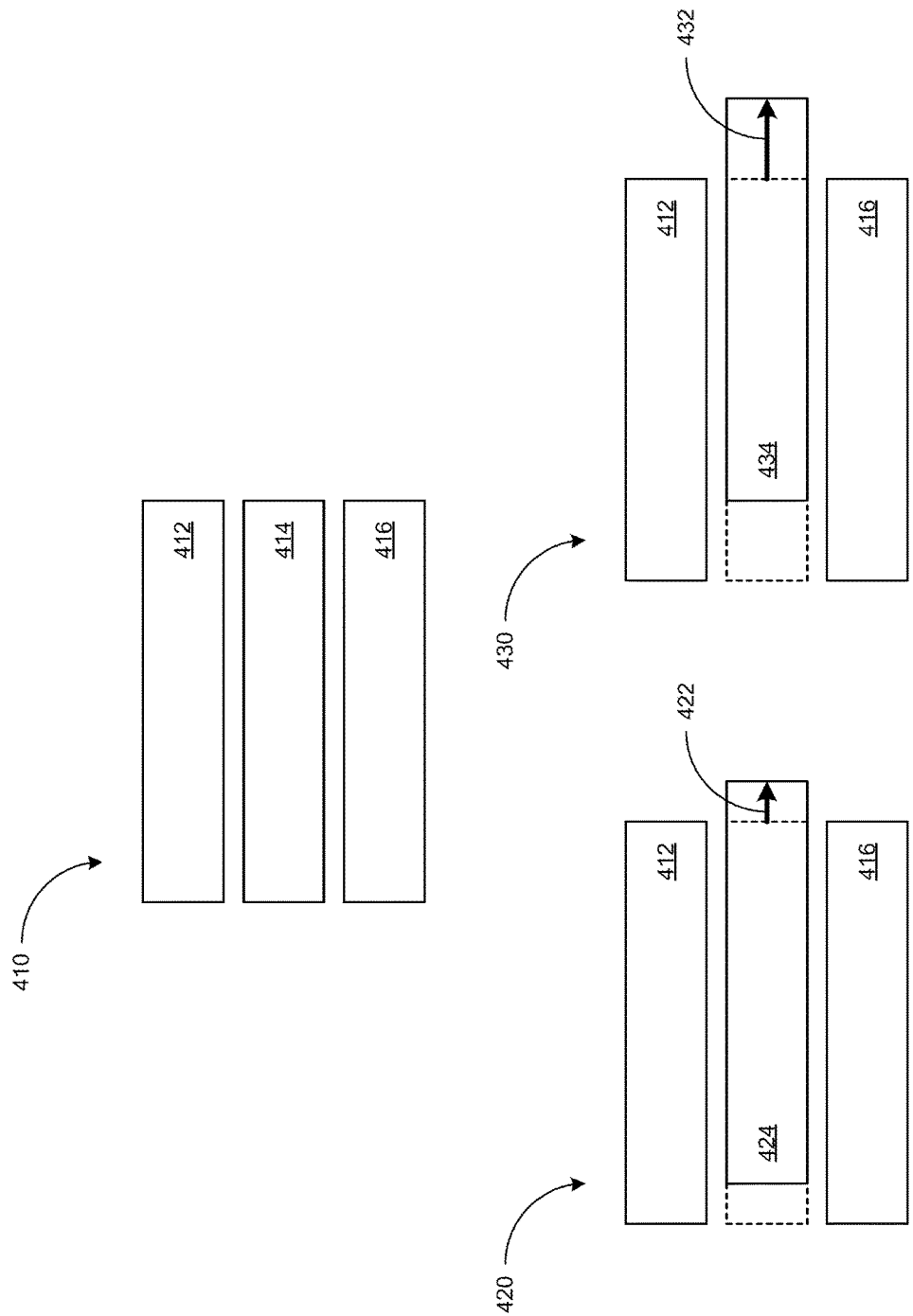
FIG. 4 illustrates an example crystalline plane system of an example electronic memory device, in accordance with present implementations.

FIG. 4 illustrates an example crystalline plane system of an example electronic memory device, in accordance with present implementations. As illustrated by way of example in FIG. 4, an example crystalline plane system 400 includes a first crystalline plane state 410, a second crystalline plane state 420, and a third crystalline plane state 430. In some implementations, the first, second, and third crystalline plane states 410, 420 and 430 correspond to stacking transitions operable as nonvolatile memory based on Berry curvature in tungsten ditelluride or the like. In some implementations, electrical properties of stacking transitions and crystalline plane states are dependent on the number of stacked crystalline planes. In some implementations, memory states resulting from the electrical properties thereof are non-destructively readable and reversible. In some implementations, energy cost of memory based on the crystalline plane system of FIG. 4 is approximately 0.1 aJ/cm$^2$. This energy cost can be 3-5 orders smaller than that in conventional systems, including dynamic RAM. Similarly, in some implementations, energy barriers for different stackings are a few meV/unit cell. This energy barrier is one to two orders of magnitude smaller than that for conventional bond rearrangement in phase-change materials. Thus, in some implementations, the example crystalline plane system supports memory devices at commercial operation with smaller package size approaching atomically thin limits, and energy usage cost. Specifically, tungsten ditelluride can form different stacking orders with distinct symmetries corresponding to one or more of the crystalline plane states 410, 420 and 430.

The first crystalline plane state 410 includes a first crystalline plane 412 in a first position, a second crystalline plane 414 in the first position, and a third crystalline plane 416 in the first position. In some implementations, the first, second, and third crystalline planes 412, 414 and 416 are arranged in a vertical stack perpendicular to a plane of the metallic layer 110. In some implementations, the metallic layer 110 is or includes the first, second, and third crystalline planes 412, 414 and 416 therein. Thus, in some implementations, the metallic layer 110 is a stack of multiple crystalline planes at the nanometer scale. In some implementations, the first, second, and third crystalline planes 412, 414 and 416 are in a first alignment configuration in the first crystalline plane state 410. In some implementations, the second crystalline plane 414 demonstrates a first electrical state property in the first position. In some implementations, the first position is a relative orientation of the lattices of the first, second, and third crystalline planes 412, 414 and 416.

The second crystalline plane state 420 includes the first crystalline plane 412 in the first position, the second crystalline plane 414 shifted by a first displacement 422 to a second position 424, and a third crystalline plane 416 in the first position. In some implementations, the second crystalline plane 414 is shifted into the second position 424 in response to current stimulation of the metallic layer 110. In some implementations, the current stimulation corresponds to the input current 210. The first displacement 422 causes a second relative orientation between the lattices of the first, second, and third crystalline planes 412, 414 and 416. In some implementations, the first displacement 422 modifies a lattice orientation of the crystalline planes 412, 414 and 416 so that the state of a Berry dipole of the metallic layer 110 changes from having a first electrical charge characteristic, to a distinct second electrical charge characteristic. In some implementations, the first displacement 422 is an interlayer sliding along a crystalline b-axis by about 0.15 lattice constant. In some implementations, no rotation of crystal orientations occurs during the electrical-field induced sliding transition along the b-axis. Accordingly, in some implementations, the second position 424 is the resultant relative orientation of the crystalline planes 412, 414 and 416 corresponding to the second electrical charge characteristic. In some implementations, application of a reversing current can revert the metallic layer 110 from the second crystalline plane state 420 to the first crystalline plane state 410.

The third crystalline plane state 430 includes the first crystalline plane 412 in the first position, the second crystalline plane 414 shifted by a second displacement 432 to a third position 434, and a third crystalline plane 416 in the first position. In some implementations, the second crystalline plane 414 is shifted into the third position 434 in response to current stimulation of the metallic layer 110. In some implementations, the current stimulation corresponds to the input current 210. In some implementations, the current stimulation corresponds to an input current having one or more electrical characteristics different than an input current applied to cause a change in state from the first crystalline plane state 410 to the second crystalline plane state 420. The second displacement 432 causes a third relative orientation between the lattices of the first, second, and third crystalline planes 412, 414 and 416. In some implementations, the second displacement 432 modifies a lattice orientation of the crystalline planes 412, 414 and 416 so that the state of a Berry dipole of the metallic layer 110 changes from having a second electrical charge characteristic, to a third electrical charge characteristic distinct from both the first and the second electrical charge characteristics. Accordingly, in some implementations, the third position 434 is the resultant relative orientation of the crystalline planes 412, 414 and 416 corresponding to the third electrical charge characteristic. In some implementations, application of a reversing current can revert the metallic layer 110 from the third crystalline plane state 430 to the second crystalline plane state 420. It is to be understood that the reversing current can differ from the input current in one or more characteristics, including but not limited to magnitude, frequency, and the like. It is to be further understood that the magnitude of the reversing current need not, and in the case of certain doping states of the metallic layer, cannot, be the equal and opposite of the input current causing the first displacement.

Figure 5A:
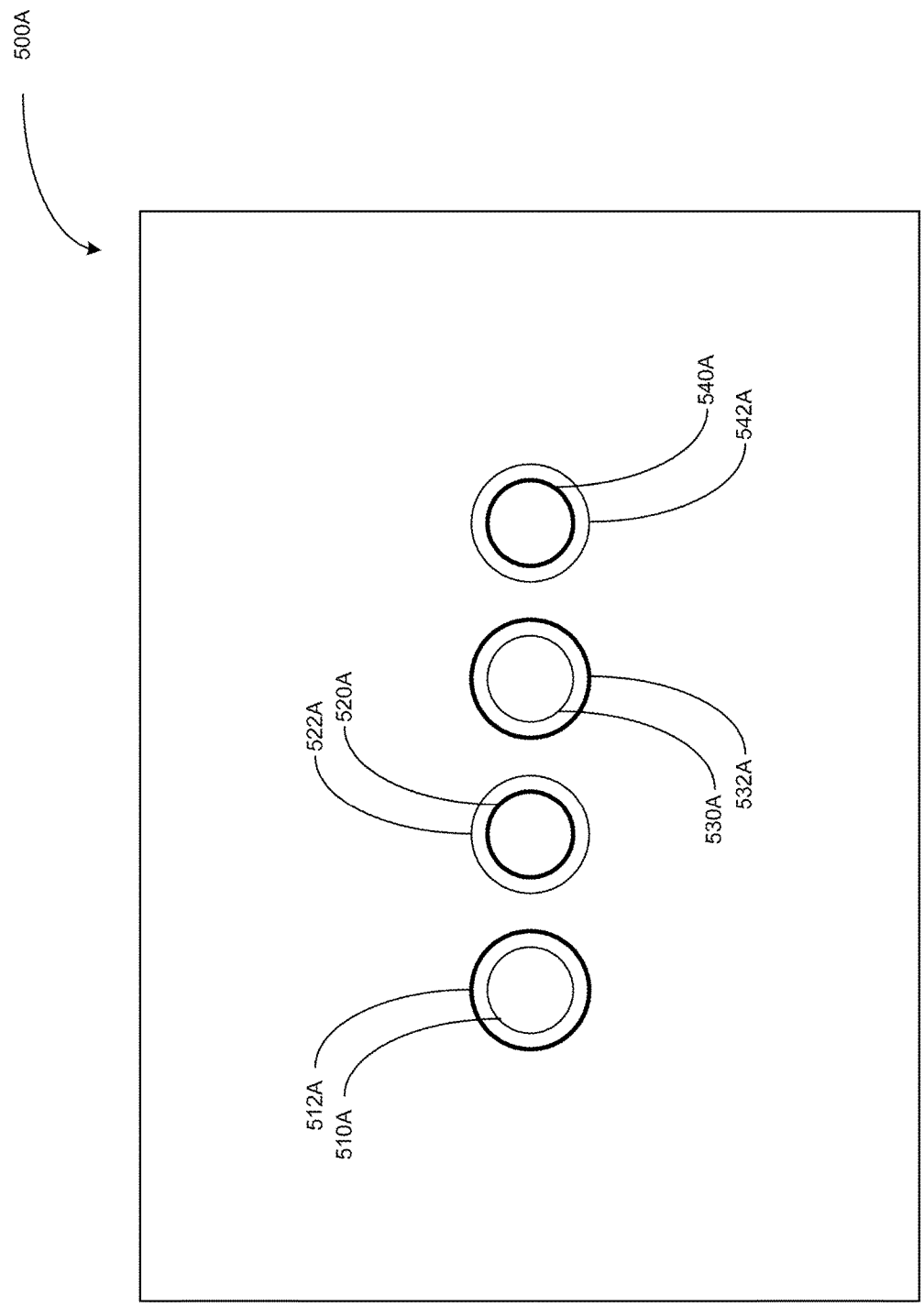
FIG. 5A illustrates a first example electrical charge response of an example electronic memory device, in accordance with present implementations.
Figure 5B:
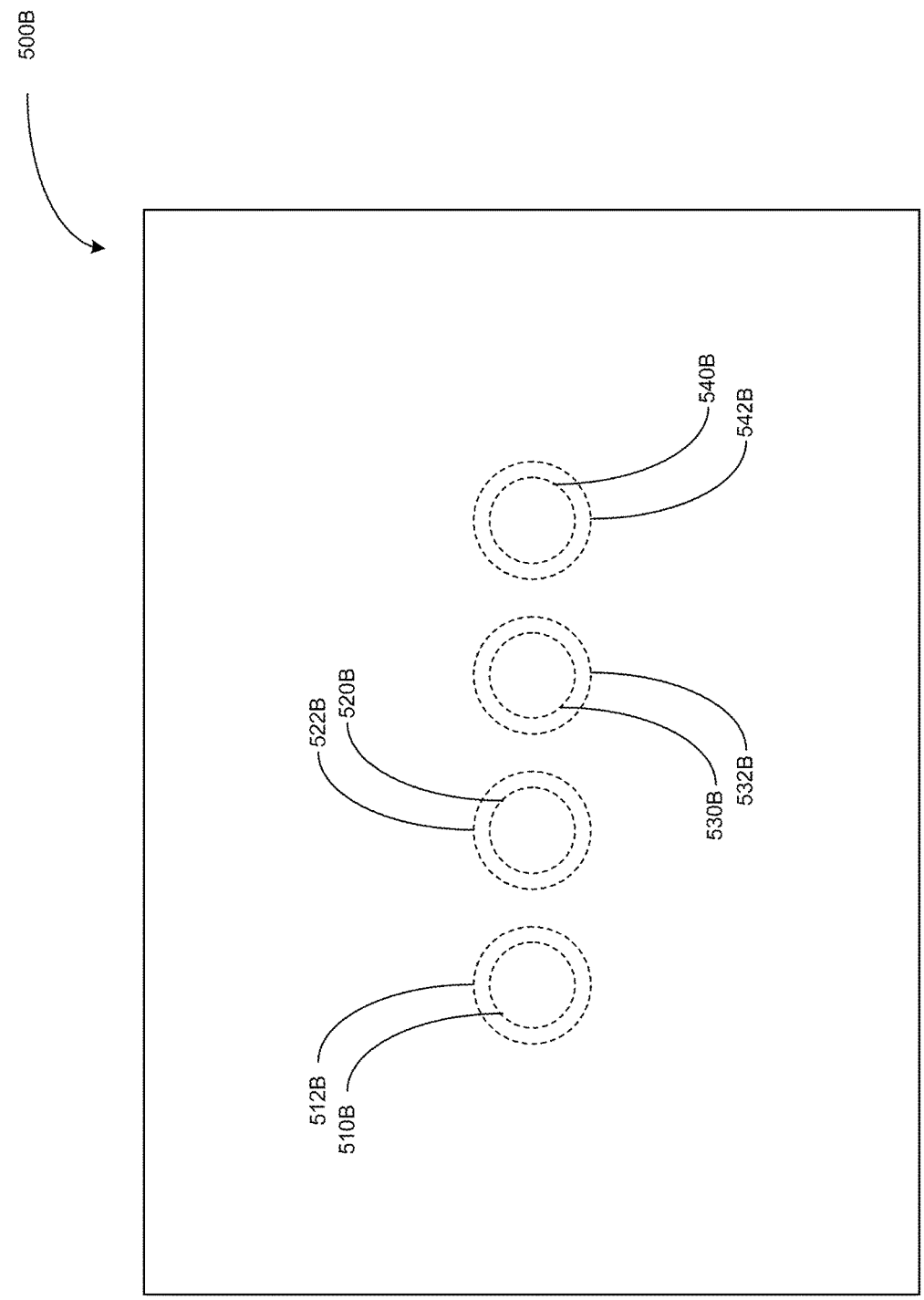
FIG. 5B illustrates a second example electrical charge response of an example electronic memory device, in accordance with present implementations.
Figure 5C:
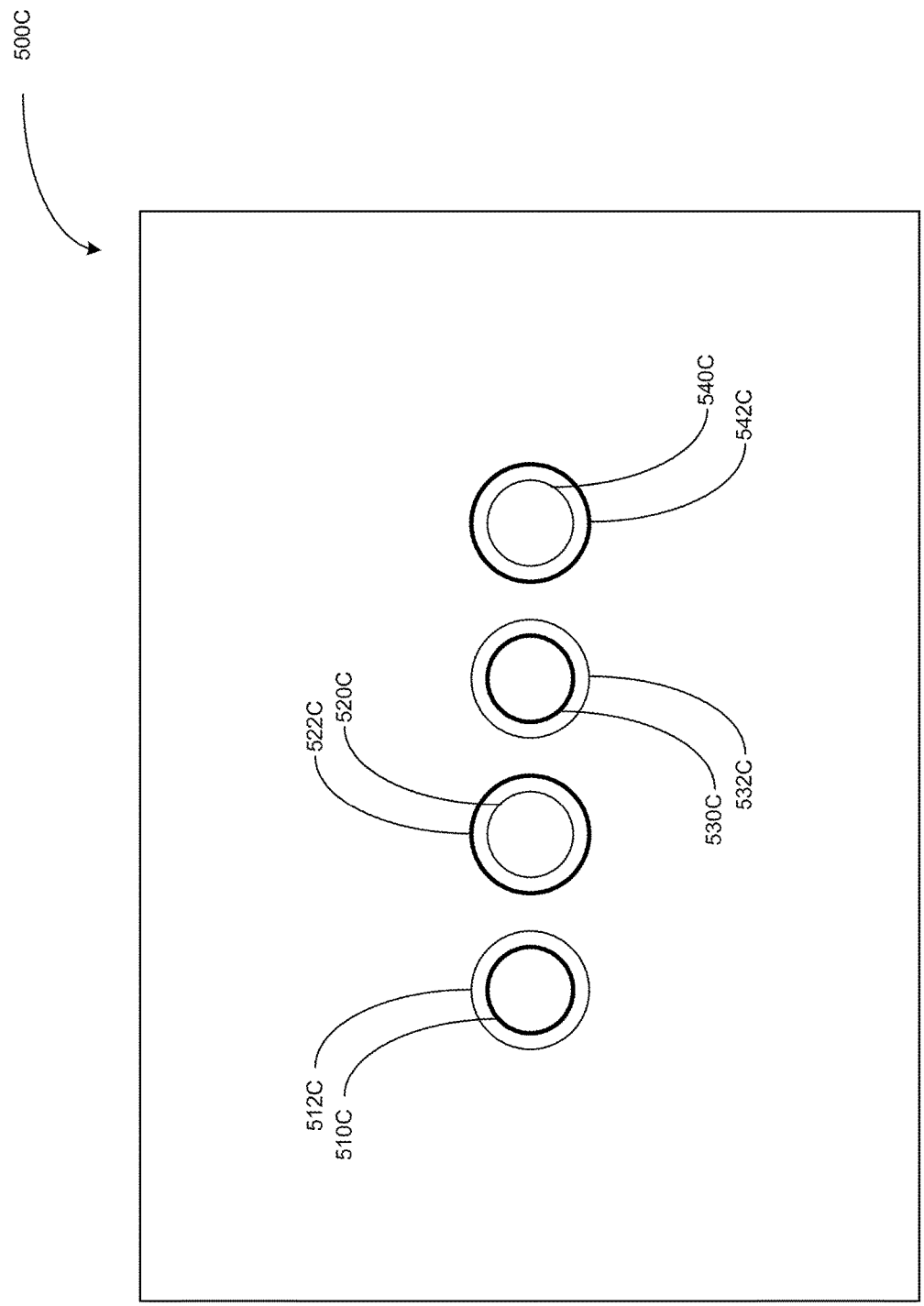
FIG. 5C illustrates a third example electrical charge response of an example electronic memory device, in accordance with present implementations.

FIGS. 5A-5C illustrate example electrical charge responses of an example electronic memory device, in accordance with present implementations. In some implementations, the example electronic charges response of FIGS. 5A-5C are within the metallic layer 110. In some implementations, the example electronic charges response of FIGS. 5A-5C are within at least one of the first and second memory state regions 210 and 212. In some implementations, the example electronic charges response of FIGS. 5A-5C are within at least one of the first and second memory cells 320 and 330. In some implementations, the example electronic device is operable to change state between any of the three states of FIGS. 5A-5C. By changing between these electrical states, the example electronic memory device is operable to represent three storage states thereby. In some implementations, the example electronic device is operable to represent two binary storage states including any two of the three response states associated with FIGS. 5A-5C. Alternatively, in some implementations, the example electronic device is operable to represent two binary storage states and one quantum storage state including all three response states associated with FIGS. 5A-5C. Thus, the example electronic memory device is operable to achieve the technological solutions of binary electronic memory storage and quantum electronic memory storage, both at nanometer scale. A Berry curvature dipole in accordance with FIGS. 5A-5C can be described by Equation 4 generalizing Equation 3, where $\Omega_j$ is a Berry curvature along a j direction, and $f_0$ is the equilibrium electron distribution:

$$D_{ij} = -\int_k \Omega_j \partial_i f_0 \qquad \text{Eq. (4)}$$

FIG. 5A illustrates a first example electrical charge response of an example electronic memory device, in accordance with present implementations. As illustrated by way of example in FIG. 5A, a first example electrical charge response 500A includes a first response dipole pair 510A and 512A, a second response dipole pair 520A and 522A, a third response dipole pair 530A and 532A, and a fourth response dipole pair 540A and 542A.

The first response dipole pair includes a positively charged outer dipole ring 510A and a negatively charged inner dipole ring 512A. The second response dipole pair includes a negatively charged outer dipole ring 520A and a positively charged inner dipole ring 522A. The third response dipole pair corresponds to the first response dipole pair, and has a positively charged outer dipole ring 530A and a negatively charged inner dipole ring 532A. It is to be understood that the magnitude of each ring of the third response dipole pair can vary from the magnitude of the first response dipole pair. The fourth response dipole pair corresponds to the second response dipole pair, and has a negatively charged outer dipole ring 540A and a positively charged inner dipole ring 542A. It is to be understood that the magnitude of each ring of the fourth response dipole pair can vary from the magnitude of the second response dipole pair. In some implementations, the first electrical charge response 500A is associated with one of a binary ON state or a binary OFF state. It is to be understood that binary states in accordance with present implementations can also be described as "1" and "0" states, "true" and "false" states, and the like.

FIG. 5B illustrates a second example electrical charge response of an example electronic memory device, in accordance with present implementations. As illustrated by way of example in FIG. 5B, a second example electrical charge response 500B includes a first response dipole pair 510B and 512B, a second response dipole pair 520B and 522B, a third response dipole pair 530B and 532B, and a fourth response dipole pair 540B and 542B.

The first response dipole pair includes a substantially neutrally charged outer dipole ring 510B and inner dipole ring 512B. The second response dipole pair includes a substantially neutrally charged outer dipole ring 520B and inner dipole ring 522B. The third response dipole pair includes a substantially neutrally charged outer dipole ring 530B and inner dipole ring 532B. The fourth response dipole pair includes a substantially neutrally charged outer dipole ring 540B and inner dipole ring 542B. Thus, in some implementations, the second electrical charge response 500B includes a substantially neutral charge state. In some implementations, the second electrical charge response 500B is associated with a quantum state electrically and logically distinct from either of a binary ON state and a binary OFF state.

FIG. 5C illustrates a third example electrical charge response of an example electronic memory device, in accordance with present implementations. As illustrated by way of example in FIG. 5C, a third example electrical charge response 500C includes a first response dipole pair 510C and 512C, a second response dipole pair 520C and 522C, a third response dipole pair 530C and 532C, and a fourth response dipole pair 540C and 542C.

The first response dipole pair includes a negatively charged outer dipole ring 510C and a positively charged inner dipole ring 512C. The second response dipole pair includes a positively charged outer dipole ring 520C and a negatively charged inner dipole ring 522C. The third response dipole pair corresponds to the first response dipole pair, and has a negatively charged outer dipole ring 530C and a positively charged inner dipole ring 532C. It is to be understood that the magnitude of each ring of the third response dipole pair can vary from the magnitude of the first response dipole pair. The fourth response dipole pair corresponds to the second response dipole pair, and has a positively charged outer dipole ring 540C and a negatively charged inner dipole ring 542C. It is to be understood that the magnitude of each ring of the fourth response dipole pair can vary from the magnitude of the second response dipole pair. In some implementations, the third electrical charge response 500C is associated with one of a binary ON state or a binary OFF state opposite to a binary state associated with the first electrical charge response 500A.

Figure 6:
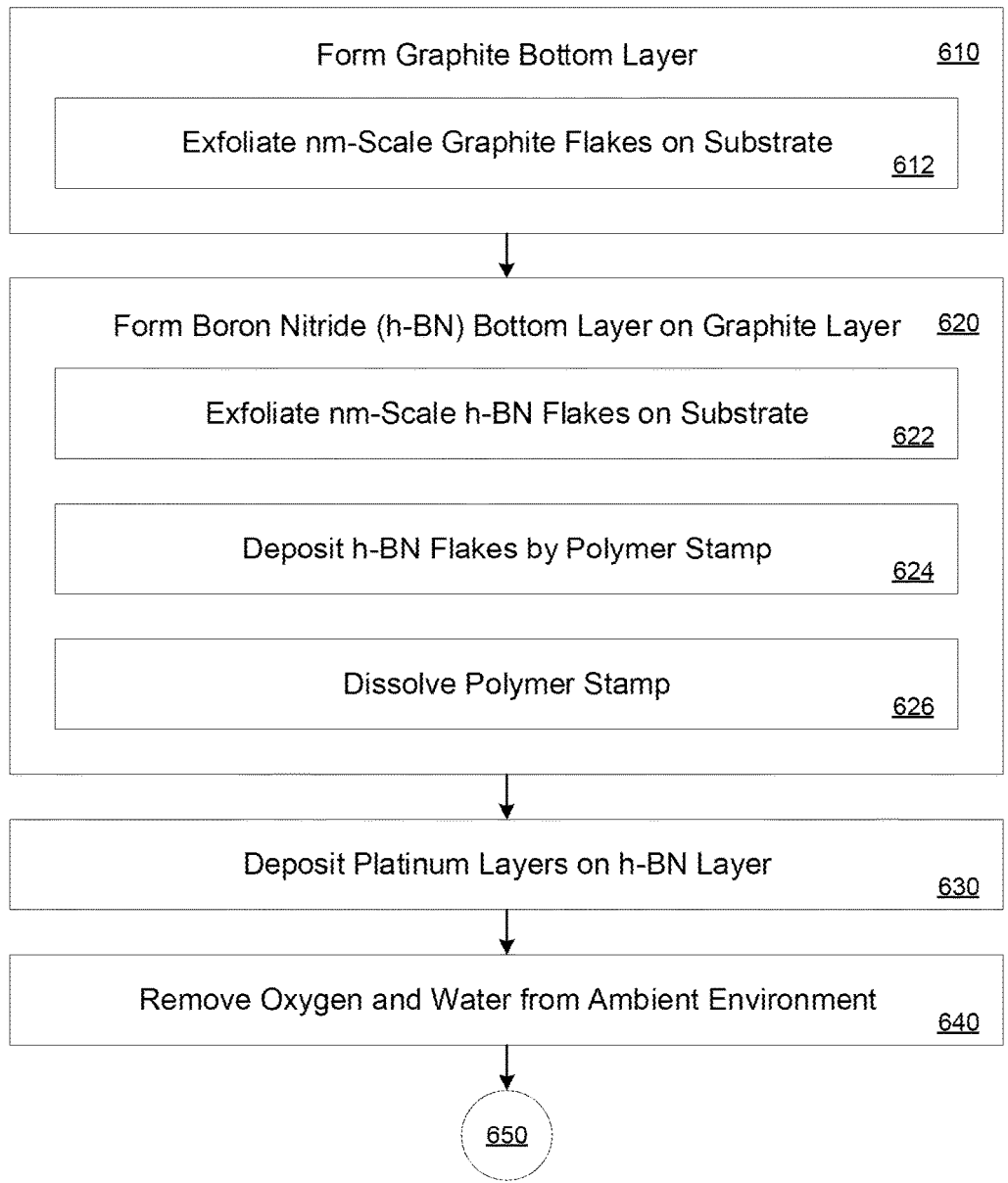
FIG. 6 illustrates an example method of manufacturing an example electronic device, in accordance with present implementations.

FIG. 6 illustrates an example method of manufacturing an example electronic device, in accordance with present implementations. In some implementations, the example device of FIGS. 1A-1C is manufactured by method 600 according to present implementations. In some implementations, the method 600 begins at step 610.

At step 610, an example system forms a graphite bottom layer of an example electronic device. In some implementations, step 600 includes step 612. At step 612, the example system exfoliates nanometer-scale graphite flakes onto a substrate. In some implementations, the example system exfoliates graphite into graphite into flakes of various sizes. In some implementations, the example system selects, obtains, captures, or the like, graphite flakes between 2 nm and 5 nm thick. In some implementations, the graphite flakes are exfoliated onto a substrate including at least one of silicon and silicon dioxide. In some implementations, the substrate has a thickness of approximately 280 nm. The method 600 then continues to step 620.

At step 620, the example system forms a boron nitride bottom layer on the graphite layer. In some implementations, the boron nitride layer is or includes hexagonal boron nitride (h-BN). In some implementations, step 620 includes at least one of steps 622, 624 and 626. At step 622, the example system exfoliates nanometer-scale boron nitride flakes onto the substrate. In some implementations, the example system selects, obtains, captures, or the like, boron nitride flakes between 10 nm and 30 nm thick. In some implementations, the boron nitride flakes are exfoliated onto a substrate including at least one of silicon and silicon dioxide. In some implementations, the substrate has a thickness of o approximately 280 nm. In some implementations, the substrate is the same as or similar on at least one of orientation, dimension, composition, and the like, as the substrate on which the graphite layer is formed. In some implementations, the graphite is exfoliated on a first region of the substrate and the boron nitride is exfoliated on a second region of the substrate. At step 624, the example system deposits the boron nitride flakes onto the graphite layer by polymer stamp. In some implementations, the depositing includes depositing by a polymer-based dry stamp technique, where one or more exfoliated boron nitride or hexagonal boron nitride flakes are contacted with a polymer stamp including or comprising an adhesive material. Further, In some implementations, the contacted flake or flakes are deposited on the graphite base layer by moving the stamp to contact an upper surface of the graphite layer. At step 626, the example system dissolves the polymer stamp. In some implementations, the dissolving includes dissolving the polymer stamp by a chemical, mechanical, or electrical process to remove the polymer stamp material and retain the boron nitride or like material on the graphite layer. In some implementations, the process of stamping and dissolving is repeated to achieve a particular predetermined thickness of the boron nitride layer at nanometer scale. The method 600 then continues to step 630.

At step 630, the example system deposits one or more platinum layers on the boron nitride layer. In some implementations, one or more contacts are patterned on the boron nitride layer. In some implementations, the depositing the platinum layers includes forming one or more of the device terminal 130 and 132, and the cell terminals 140, 142, 150 and 152. In some implementations, the platinum layers are approximately 5 nm in thickness. In some implementations, the depositing the platinum layers is preceded by a washing process. In some implementations, the washing process is or includes an annealing process at 400° C. at high vacuum. The method 600 then continues to step 640.

At step 640, the example system removes oxygen and water from the ambient manufacturing environment. In some implementations, the partially constructed example electronic memory device including the graphite bottom layer, the boron nitride bottom layer, and the platinum players is transferred to a glovebox environment. In some implementations, at least one of oxygen and water are removed from the glovebox environment. In some implementations, the glovebox environment includes one or more materials for manufacturing the example electronic memory device. The method 600 then continues to step 650.

Figure 7:
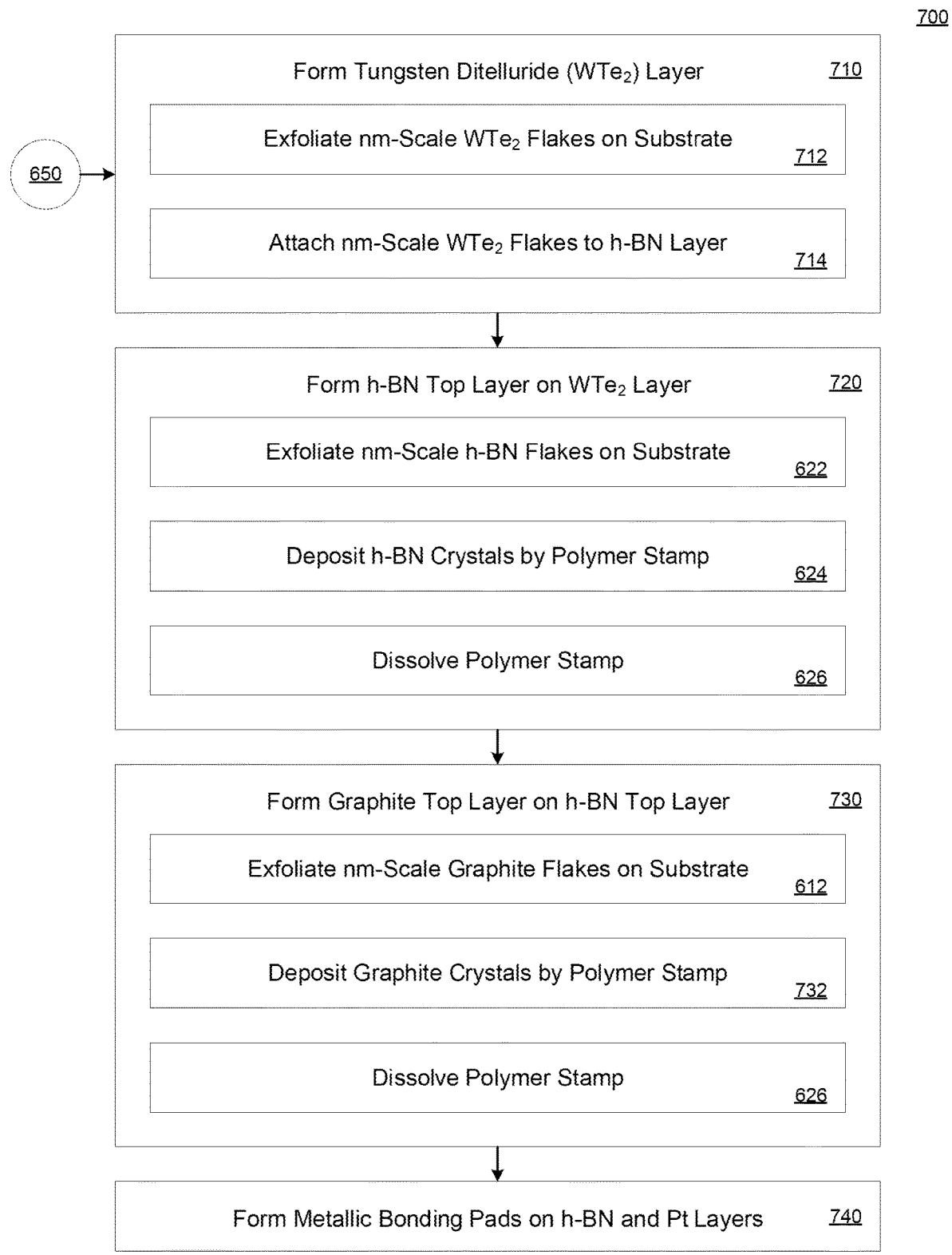
FIG. 7 illustrates an example method of manufacturing an example electronic device further to the example method of FIG. 6.

FIG. 7 illustrates an example method of manufacturing an example electronic device further to the example method of FIG. 6. In some implementations, the example device of FIGS. 1A-1C is manufactured by method 700 according to present implementations. In some implementations, the method 700 begins at step 650. The method 700 then continues to step 710.

At step 710, the example system forms a tungsten ditelluride layer. In some implementations, step 710 includes at least one of steps 712 and 714. At step 712, the example system exfoliates nanometer-scale boron nitride flakes onto the substrate. In some implementations, the example system exfoliates tungsten ditelluride flakes onto a different substrate than the substrate on which the graphite layer and the boron nitride flakes are disposed. At step 714, the example system attaches nanometer-scale tungsten ditelluride flakes to the boron nitride layer. In some implementations, the example system inverts, flips, or the like, partially constructed example electronic memory device so that the boron nitride bottom layer is facing toward the tungsten ditelluride flakes. Further, in some implementations, the example system removes flakes greater than 3 nm, 5 nm or the like before contacting the partially constructed example electronic memory device to the flakes. Further, in some implementations, the example system contacts a surface including the boron nitride layer and the platinum layers to one or more tungsten ditelluride flakes having a predetermined thickness. The method 700 then continues to step 720.

At step 720, the example system forms a boron nitride top layer on the tungsten ditelluride layer. In some implementations, the forming the boron nitride top layer corresponds to the forming the boron nitride bottom layer. In some implementations, step 720 includes at least one of steps 622, 624 and 626. The method 700 then continues to step 730. At step 730, the example system forms a graphite top layer on the boron nitride top layer. In some implementations, the forming the graphite top layer corresponds to the forming the graphite bottom layer. In some implementations, step 730 includes at least one of steps 612, 732 and 626. At step 732, the example system deposits graphite flakes by polymer stamp. In some implementations, the depositing graphite flakes by polymer stamp corresponds to the process for depositing boron nitride flakes on the graphite bottom layer by polymer stamping. The method 700 then continues to step 740.

At step 740, the example system forms one or more metallic bonding pads on one or more of the graphite layers and the platinum layers. In some implementations, the metallic bonding pads include at least one of chromium and gold. In some implementations, the metallic bonding pads are formed by depositing at least one of chromium and gold on at least a portion of at least one of the graphite top layer, the graphite bottom layer, and at least one of the platinum layers forming the device terminals 130 and 132, and the cell terminals 140, 142, 150 and 152. In some implementations, the depositing is or includes at least one of lithography, e-beam lithography, and metallization. In some implementations, the partially constructed example electronic memory device is removed from the glovebox prior to the depositing the metallic bonding pads. In some implementations, the method 700 ends at step 740.

Figure 8:
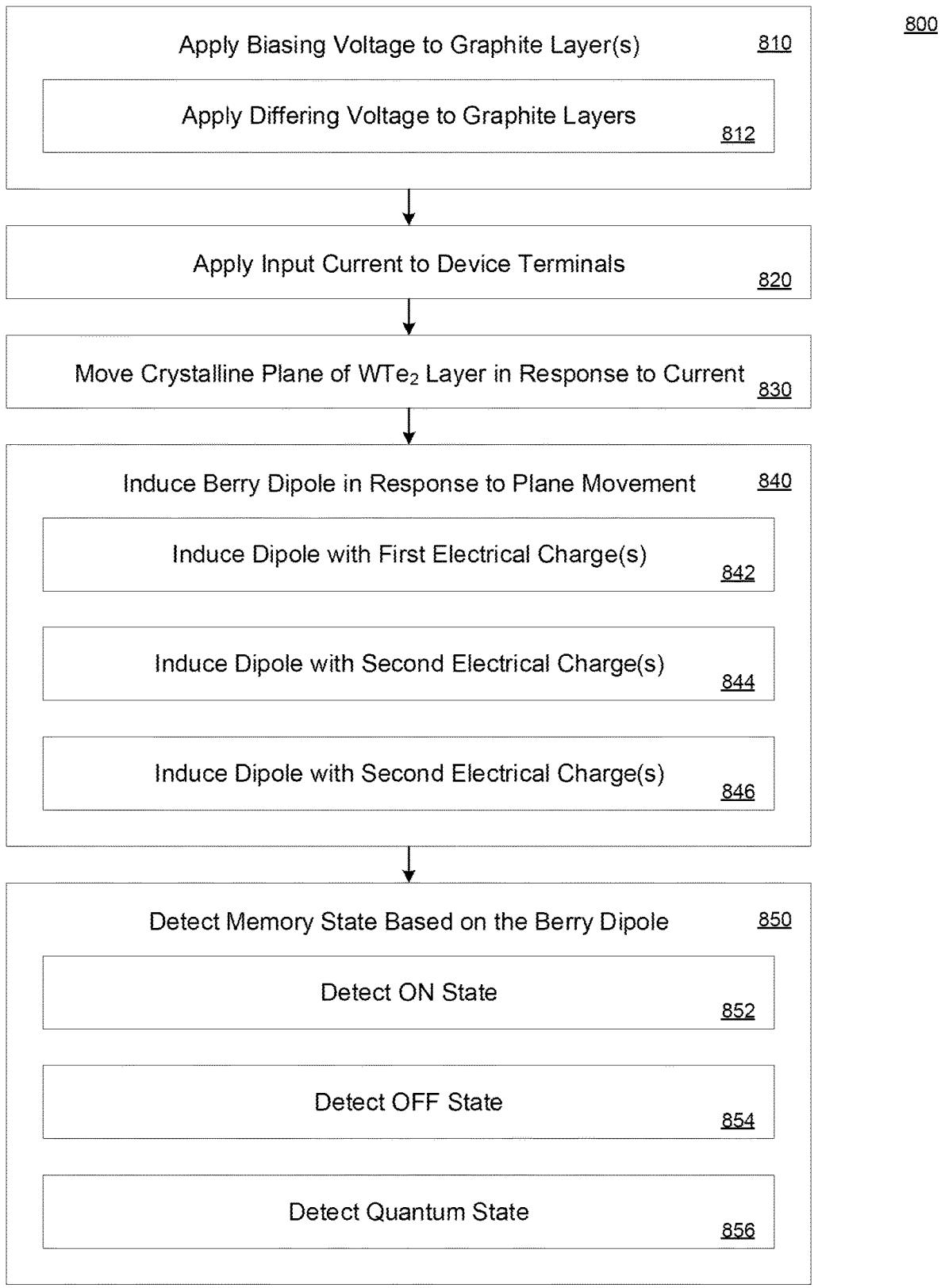
FIG. 8 illustrates an example method of operating an example electronic device, in accordance with present implementations.

FIG. 8 illustrates an example method of operating an example electronic device, in accordance with present implementations. In some implementations, the example device of at least FIGS. 1A-1C performs method 800 according to present implementations. In some implementations, the method 800 begins at step 810.

At step 810, the example system applies a biasing voltage to at least one of the graphite layers. In some implementations, the biasing circuit 340 applies the biasing voltage to the gate layers 160 and 162 or the gate terminals 316 and 318 corresponding thereto. In some implementations, step 810 includes step 812. At step 812, the example system applies differing voltages to each graphite layer. In some implementations, the example system applies a first bias voltage having a first magnitude to the gate layer 160, and a second bias voltage having a second magnitude to the gate layer 162. In some implementations, the example system applies a first bias voltage having a first direction to the gate layer 160, and a second bias voltage having a second direction to the gate layer 162. In some implementations, the example system applies a first bias voltage having a first magnitude and first direction to the gate layer 160, and a second bias voltage having a second magnitude and second direction to the gate layer 162. The method 800 then continues to step 820.

At step 820, the example system applies an input current to device terminals of the example device. In some implementations, the current source 350 applies the input current 220 to the device terminals 312 and 314. The method 800 then continues to step 830.

At step 830, the example system moves at least one crystalline plane of a tungsten ditelluride layer of the example device, in response to the input current. In some implementations, the example system moves the crystalline plane in accordance with FIG. 4. The method 800 then continues to step 840.

At step 840, the example system induces at least one Berry dipole in the tungsten ditelluride layer of the example device, in response to the movement of the crystalline plane. In some implementations, the example system induces the Berry dipole in accordance with at least one of FIGS. 5A-5C. In some implementations, step 840 includes at least one of steps 842, 844 and 846. At step 842, the example system induces at least one dipole with a first electrical charge or charge pattern. In some implementations, the example system induces the first electrical charge or charge pattern in accordance with FIG. 5A. At step 844, the example system induces at least one dipole with a second electrical charge or charge pattern. In some implementations, the example system induces the second electrical charge or charge pattern in accordance with FIG. 5B. At step 846, the example system induces at least one dipole with a third electrical charge or charge pattern. In some implementations, the example system induces the third electrical charge or charge pattern in accordance with FIG. 5C. The method 800 then continues to step 850.

At step 850, the example system detect a memory state based on the Berry dipole. In some implementations, step 850 includes at least one of steps 852, 854 and 856. In some implementations, the voltage detector 360 detects the memory state. At step 852, the example system detects an ON state corresponding to the first electrical charge or charge pattern. In some implementations, the ON state corresponds to the first electrical charge or charge pattern of FIG. 5A. At step 854, the example system detects a quantum state corresponding to the second electrical charge or charge pattern. In some implementations, the quantum state corresponds to the first electrical charge or charge pattern of FIG. 5B. At step 856, the example system detects an OFF state corresponding to the third electrical charge or charge pattern. In some implementations, the OFF state corresponds to the third electrical charge or charge pattern of FIG. 5C. In some implementations, the method 800 ends at step 850.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. An electronic memory device comprising:
   a metallic layer comprising an electronic memory cell and having a first planar crystalline structure;
   a first encapsulating layer including an encapsulating material having a second planar crystalline structure, and disposed adjacent to a first planar surface of the metallic layer; and
   a second encapsulating layer including the encapsulating material, and disposed adjacent to a second planar surface of the metallic layer.

2. The device of claim 1, wherein the metallic layer comprises tungsten ditelluride ($WTe_2$).

3. The device of claim 1, wherein the metallic layer comprises a plurality of stacked crystalline planes.

4. The device of claim 3, wherein at least one of the plurality of stacked crystalline planes are moveable in a planar direction in response to electrical stimulus.

5. The device of claim 3, wherein the plurality of stacked crystalline planes comprises an odd number of stacked crystalline planes.

6. The device of claim 1, wherein a thickness of the metallic layer in a direction perpendicular to a plane of the metallic layer is less than or equal to 5 nm.

7. The device of claim 1, further comprising:
   a first gate layer including a gate material having a third planar crystalline structure, and disposed adjacent to a planar surface of the first encapsulating layer.

8. The device of claim 1, further comprising:
   a second gate layer including the gate material, and disposed adjacent to a planar surface of the second encapsulating layer.

9. The device of claim 1, further comprising:
   a first terminal coupled to a first edge of the metallic layer; and
   a second terminal coupled to a second edge of the metallic layer opposite to the first edge.

10. The device of claim 9, wherein the first terminal and the second terminal are operably coupled to a current source.

11. The device of claim 1, further comprising:
    a third terminal coupled to a third edge of the metallic layer; and
    a fourth terminal coupled to a fourth edge of the metallic layer opposite to the third edge.

12. The device of claim 11, wherein the third terminal and the fourth terminal are operably coupled to a voltage detector.

13. A method of manufacturing an electronic memory device, comprising:
    depositing graphite crystals onto a substrate to form a gate bottom layer;
    depositing BN crystals onto the graphite bottom layer to form a BN bottom layer;
    depositing tungsten ditelluride ($WTe_2$) crystals onto the BN bottom layer to form a metallic layer;
    depositing the BN crystals onto the BN bottom layer and the metallic layer to form a BN top layer; and
    depositing the graphite crystals onto the BN top layer to form a gate top layer.

14. The method of claim 13, further comprising:
    exfoliating the $WTe_2$ crystals onto the substrate;
    wherein depositing the BN crystals comprises depositing BN crystals having a thickness between 10 nm and 30 nm.

15. The method of claim 13, further comprising:
    exfoliating the boron nitride (BN) crystals onto the substrate,
    wherein depositing the BN crystals comprises depositing BN crystals having a thickness between 10 nm and 30 nm.

16. The method of claim 13, further comprising:
    exfoliating the graphite crystals onto the substrate,
    wherein depositing the graphite crystals comprises depositing graphite crystals having a thickness between 2 nm and 5 nm.

17. The method of claim 13, further comprising:
    depositing at least one conductive layer on the BN bottom layer to form at least one conductive contact.

18. A method of operating an electronic memory device, the method comprising:
    applying an alternating current to a first terminal and a second terminal of an electronic memory device, the electronic memory device including a metallic layer having a first planar crystalline structure, a first encapsulating layer including an encapsulating material having a second planar crystalline structure, and a second encapsulating layer including the encapsulating material;
    inducing a Berry dipole at the metallic layer in response to the alternating current; and detecting the Berry dipole by a voltage detector operatively coupled to a third terminal and a fourth terminal of the electronic device.

19. The method of claim 18, wherein the inducing the Berry dipole comprises inducing one of a first dipole state, a second dipole state opposite to the first dipole state, and a third dipole state having a neutral dipole state.

20. The method of claim 18, wherein the inducing the Berry dipole comprises inducing one of a first binary state, a second binary state opposite to the first binary state, and a quantum state distinct from the first binary state and the second binary state.

* * * * *